US005895272A

United States Patent [19]
Li

[11] Patent Number: 5,895,272
[45] Date of Patent: *Apr. 20, 1999

[54] ION-IMPLANTED RESIST REMOVAL METHOD

[75] Inventor: Li Li, Meridian, Id.

[73] Assignee: Micron Technology, Inc., Boise, Id.

[*] Notice: This patent is subject to a terminal disclaimer.

[21] Appl. No.: 08/832,418

[22] Filed: Apr. 2, 1997

Related U.S. Application Data

[63] Continuation of application No. 08/611,770, Mar. 6, 1996, Pat. No. 5,651,860.

[51] Int. Cl.$^6$ .......................... H01L 21/306; B44C 1/22
[52] U.S. Cl. ..................... 438/705; 438/948; 134/2; 134/4; 216/49; 216/58
[58] Field of Search ..................... 134/2, 4; 216/58, 216/83, 49; 438/705, 980, 948

[56] References Cited

U.S. PATENT DOCUMENTS

| 4,296,146 | 10/1981 | Penn | 427/58 |
|---|---|---|---|
| 4,855,952 | 8/1989 | Kiyosumi | 365/149 |
| 4,861,424 | 8/1989 | Fujimura et al. | 156/643 |
| 5,037,506 | 8/1991 | Gupta et al. | 156/646 |
| 5,298,112 | 3/1994 | Hayasaka et al. | 156/643 |
| 5,369,061 | 11/1994 | Nagayama | 437/228 |
| 5,382,316 | 1/1995 | Hills et al. | 156/643 |
| 5,403,436 | 4/1995 | Fujimura et al. | 156/643 |

OTHER PUBLICATIONS

Hirose et al., "Ion–Implanted Photoresist and Damage–Free Stripping," *J. Electrochem. Soc.*, 141(1), 192–205 (1994).

Ohmura et al., "Enhanced hydrogenation and acceptor passivation Si by pressurized water boiling," *Appl. Phys. Lett.*, 67(1), 64–66 (1995).

Rotondaro et al., "A Semi–Quantitative Method for Studying Phototresist Stripping," IMEC, Lab Chem. Biolog., Belgium, 6 pages (undated).

*Primary Examiner*—Ponnathapura Achutamurthy
*Assistant Examiner*—P. Ponnalun
*Attorney, Agent, or Firm*—Mueting, Raasch & Gebhardt, P.A.

[57] ABSTRACT

A method of removing a resist layer formed on a substrate wherein the resist layer includes an ion-implanted upper region. The method includes hydrogenating the ion implanted upper region of the resist layer resulting in the hydrogenated ion-implanted upper region. The resist layer, including the hydrogenated ion-implanted upper region is then removed. A hydrogenation of the ion-implanted upper region may be performed by immersing the resist layer, including the ion-implanted upper region, into pressurized boiling water, and/or treating the ion-implanted upper region with pressurized water vapor.

14 Claims, 2 Drawing Sheets

ION-IMPLANTED RESIST REMOVAL METHOD

This is a continuation of application Ser. No. 08/611,770, filed Mar. 6, 1996, U.S. Pat. No. 5,651,860.

FIELD OF THE INVENTION

The present invention relates to the fabrication of semiconductor devices. In particular, the present invention relates to methods of removing ion-implanted resist layers in the fabrication of a semiconductor device.

BACKGROUND OF THE INVENTION

Resist plays a major role in lithography processes for fabrication of semiconductor devices in which the sizes, as well as positions of transistors, resistors, and interconnects are precisely determined on the wafer and fabricated. By using patterned resist, selective etching and impurity doping can be performed. Resists are not a part of the device structure itself, but rather a masking material to enhance selectivity. It is essential to utilize a resist removal process which removes the resist after it has been utilized but which does not damage the fabricated semiconductor device.

As semiconductor devices become more integrated and miniaturized, ion implantation is extensively employed to accurately control impurity distributions in the semiconductor substrate. The concentration and depth of the dopant impurity is controlled by varying the dose of the dopant, the acceleration energy, and the ion current. During this process, a patterned resist is often used for the selected implant of ions.

Generally, an ion implantation process for fabricating a semiconductor device utilizes a resist layer formed from a resist material typically including a matrix material or resin and a sensitizer which is a photoactive compound (PAC). Photoresists include both positive and negative photoresists. One common photoresist includes diazonaphtoquinone (DQ), which acts as the PAC, and novolak, a phenolic-formaldehyde resin. A mask is utilized to expose portions of the photoresist layer to UV light and then the photoresist layer is developed resulting in a patterned resist layer. The patterned resist layer is used so that only selected portions of an underlying substrate are implanted with ions during ion implantation. The resist layer must be removed after the ion implantation is over before proceeding to the next step in the fabrication of the semiconductor device. Various processes have been used in the past for the removal of the resist. Such processes include, but are not limited to, wet chemical etching processes, e.g., in a mixed solution of sulphuric acid and hydrogen peroxide, and dry plasma etching processes, e.g., in an oxygen plasma ashing process.

However, when high doses of ions, for example, such as doses more than $1 \times 10^{14}$ atoms/cm$^2$, are implanted, the ions are also implanted into the resist layer such that an upper region of the resist layer becomes physically and chemically rigid. The formation of an implanted upper region of the resist layer has been called carbonization and the designated region has been referred to as the carbonized region. However, as indicated in the article "Ion-Implanted Photoresist and Damage-Free Stripping," by Kouichi Hirose, et al., *J. Electrochem. Soc.*, Vol. 141, No. 1, January 1994, the ion-implanted upper region of the resist layer is difficult to remove because the surface has an extremely low hydrogen concentration forming an inactive high-polymer layer as opposed to the carbonization of the surface.

Because of the ion implanted upper region of the resist layer, resist removal, for example, by O$_2$ plasma ashing, causes damage to the substrate on which the resist is formed. During such ashing, cracks may be generated in the resist film which can lead to sudden and intense ashing of the resist inside and further result in damage to the surface region of the substrate. For example, a gate oxide layer of a semiconductor device fabricated under the resist layer may be damaged or degraded.

As such, additional, complicated, time consuming and costly processes have been required to perform the difficult removal of the resist layer when high doses of ions are implanted because of the resulting low hydrogen concentration of the upper region. One such process is described in U.S. Pat. No. 4,861,424 to Fujimura et al. which utilizes two etching processes to carry out the removal of the resist layer. Further, as described above, if only conventional processes are utilized for the removal of the resist, a fabricated portion of the substrate under the resist layer may be damaged or degraded. Therefore, there is a need in the art for improved ion-implanted resist removal methods.

SUMMARY OF THE INVENTION

An improved method for removing a resist layer formed on a substrate is described. The resist layer includes an ion-implanted upper region. The ion-implanted upper region of the resist layer is hydrogenated resulting in a hydrogenated ion-implanted upper region. The resist layer, including the hydrogenated ion-implanted upper region, is then removed.

In one embodiment of the method, the hydrogenation of the ion-implanted upper region of the resist layer is performed by immersing the resist layer including the ion-implanted upper region into pressurized boiling water.

In another embodiment of the method, the hydrogenation of the ion-implanted upper region of the resist layer is performed by treating the resist layer with pressurized water vapor.

In yet another embodiment of the invention, the hydrogenation step includes increasing the hydrogen concentration of the upper region of the resist layer from a first concentration resulting from implantation of ions in the resist layer to a second concentration greater than the first concentration. Further, the method may include increasing the hydrogen concentration from the first concentration to a second concentration substantially equivalent to or greater than the hydrogen concentration of the resist layer prior to ion implantation.

DETAILED DESCRIPTION OF THE PREFERRED EMBODIMENTS

FIGS. 1A–1D show cross-sectional views illustrating processing steps for use in the fabrication of semiconductor devices in accordance with the present invention. It should be readily apparent that the processing steps are only a portion of the entire fabrication process. The present invention particularly deals with the method of removing a heavily doped resist used in the fabrication of semiconductor devices.

Figure 2:
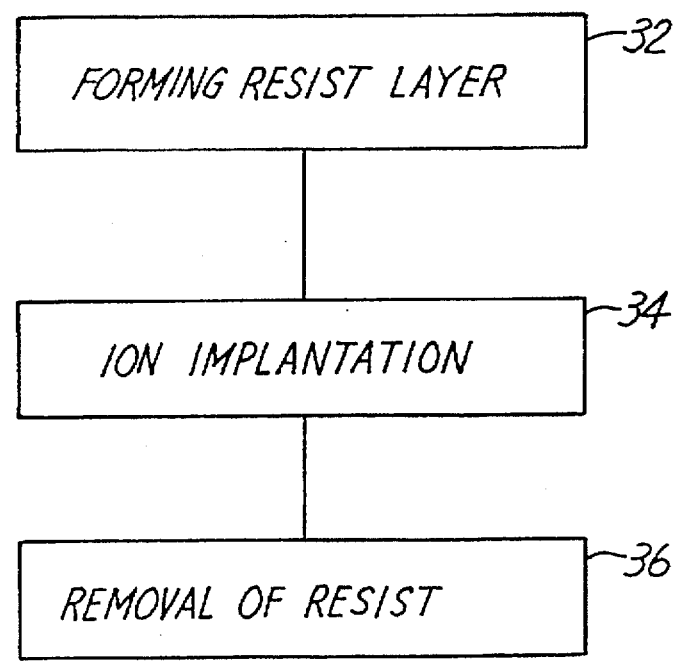
FIG. 2 is a flow diagram generally illustrating the use of resist and the removal of the resist used for semiconductor device fabrication in accordance with the present invention.

FIG. 2 generally illustrates the steps for utilizing a resist in a semiconductor device fabrication process. Generally, a resist layer is formed as shown in block 32, ions are implanted through openings in a resist layer as shown in block 34, and the resist layer is then removed as shown in block 36. In accordance with the present invention, the removal of the resist as shown in block 36 is further detailed by the general flow diagram of FIG. 3. The removal of the resist layer includes the step of hydrogenating the resist layer as represented by block 40, and then removing the resist layer by application of a standard resist removal process, block 42.

Figure 1A:
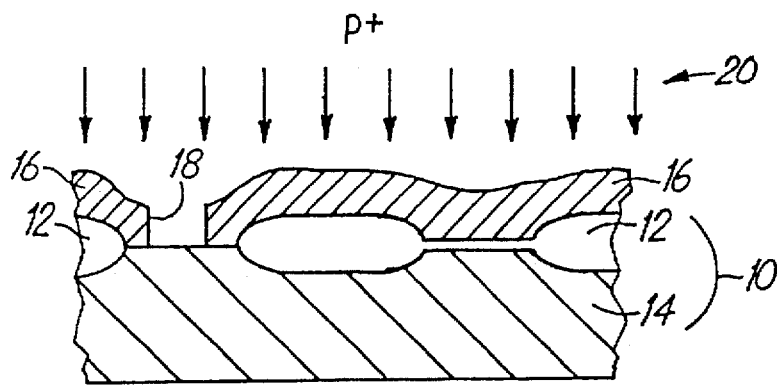
FIG. 1A is a partial cross-sectional view of a substrate having oxide formed in a region thereof on which a resist layer is formed to illustrate an ion implantation step.

The methods in accordance with the present invention shall further be described in detail with reference to FIGS. 1A–1D, FIG. 2, and FIG. 3. In FIG. 1A, a resist, for example, such as novolak/diazonaphtoquinone or novolak/quinonediazide resist, is applied, formed, coated, or deposited on a substrate 10. The resist may be applied by a spinning and curing process or any other method of resist application as is known to one skilled in the art. The resist applied to substrate 10 forms a resist layer 16, which has a thickness in the range of about 0.5 microns to about 1.5 microns, preferably in the range of about 0.9 microns to about 1.1 microns.

Generally, resist materials are used to provide detailed patterns on a substrate surface and/or to thin film's applied thereto. Such resist materials are photosensitive in nature, being characterized by differential reactivity to specific liquid solvents after exposure to any energy source, such as, for example, ultraviolet (UV) radiation. Generally, the application of a layer of resist material to a substrate, such as substrate 10, is followed by a selective exposure of the resist layer to a UV source, wherein portions of the resist layer are changed in character due to their exposure to the UV source. After such exposure, the resist layers are developed by a development process, such as those employing liquid chemical solvents, to selectively remove portions of the resist for providing a desired pattern. Many different resist materials are available, including both negative and positive resist materials and the present invention may be utilized to remove any of the resists used by those skilled in the art for semiconductor fabrication which after ion implantation have a surface with a reduced hydrogen concentration as further described below.

As shown in FIG. 1A, opening 18 was selectively created before implanting high doses of ions into the substrate 10. Substrate 10 includes a silicon substrate 14 and oxide layers 12 formed in a surface region of the silicon substrate 14, as is readily known to one skilled in the art. As utilized herein, substrate refers to any layer or material having a surface upon which a resist layer is formed. The opening 18 allows for implanting high doses of ions into the silicon substrate 14. The creation of openings 18 in the resist layer 16 completes the process of forming the resist layer as shown by block 32 of FIG. 2.

As shown in FIG. 1A, high doses of phosphorus ions are implanted into silicon substrate 14 through opening 18 in the resist layer 16. For example, the phosphorus ions may have a dosage in the range of about $1\times10^{14}$ atoms/cm$^2$ to about $1\times10^{16}$ atoms/cm$^2$. The phosphorous ion implantation may be performed, for example, at an energy in the range of about 50 KeV (kiloelectron voltage) to about 200 KeV. Ion implantation is readily known to one skilled in the art and has been extensively documented; therefore, description with reference to the ion implantation step 34 of FIG. 2 shall be given only in the general sense. Various types of ions can be implanted by ion implantation, including, for example, phosphorus ions, arsenic ions, boron ions, etc. and the present invention is not limited to any one particular dopant. Any dopant which is utilized in conjunction with ion-implantation resist fabrication processes may be utilized as is known to one skilled in the art. The present invention is particularly beneficial for ions implanted at dosages in the range of about $1\times10^{14}$ atoms/cm$^2$ to about $1\times10^{16}$ atoms/cm$^2$.

Figure 1B:
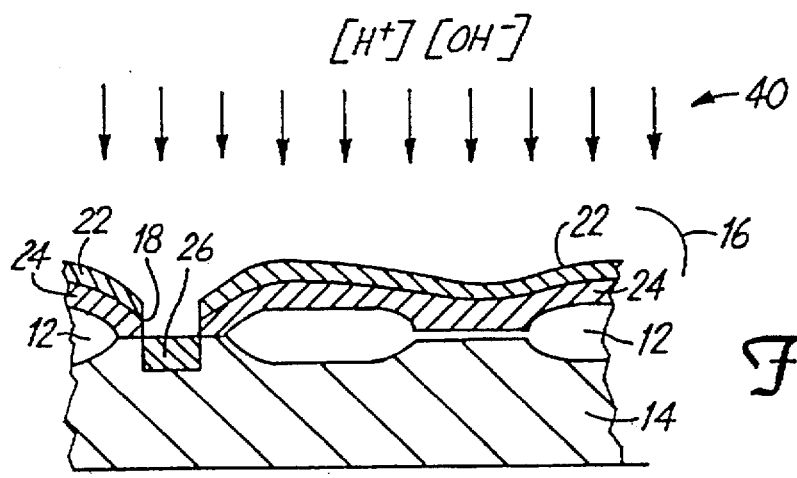
FIG. 1B is the partial cross-sectional view of FIG. 1A illustrating the step of hydrogenation of an ion implanted upper region of the resist layer resulting from the ion implantation step.
Figure 1C:
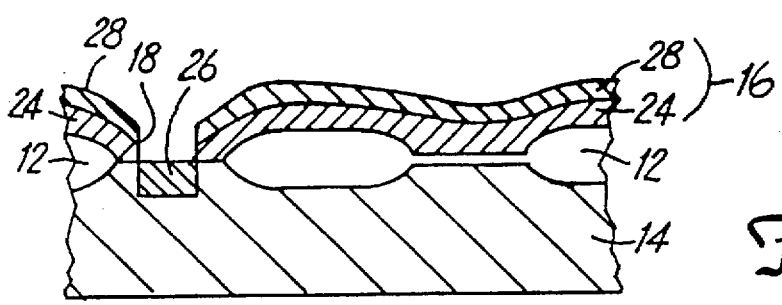
FIG. 1C is the partial cross-sectional view of FIG. 1B illustrating the hydrogenated surface region of the resist after the hydrogenation step.

As shown in FIG. 1A, many ions are implanted per ion implantation step 34 to create doped substrate 26. The ions are also implanted into the resist layer 16. The ion implantation into the resist layer 16, creates an upper region 22 and a lower resist region 24 as shown in FIG. 1B. The thickness of the upper resist region 22 is about 0.1 microns to about 0.5 microns in thickness. Of course, this thickness will depend on the ion dosage used for the ion implantation process. This upper resist region 22 is the resist region which is difficult to remove, as described previously in the Background of the Invention section herein. The hydrogen concentration of the upper resist layer 22 is substantially decreased in the ion implantation step 34. The energy which the resist sees during the ion implantation step is substantially equal to the acceleration voltage times the dose of the ion implantation. As the energy increases, hydrogen is off-gassed in larger volume from the surface of the resist layer 16. This induces a chemical reaction in the resist layer to make its binding state more stable. As the energy applied to the resist approaches a particular level, little hydrogen remains at the surface of the resist layer. Out-gassing of hydrogen starts to reduce at this level, but prior to this level during the out-gassing of hydrogen, the characteristics of the surface of the resist layer 16 change, for example, from a hydrocarbon-type layer with unstable or weak C—H and O—H bonds to an inorganic-like and crystal-like layer featuring strong atom-to-atom bonds such as C—O, C—C, and C—S bonds. Therefore, when the ions are implanted in the resist layer 16, a hardened upper region 22 of resist layer 16 is formed at its surface. The hardened surface layer is generally an inactive polymeric network which significantly lacks hydrogen.

Figure 3:
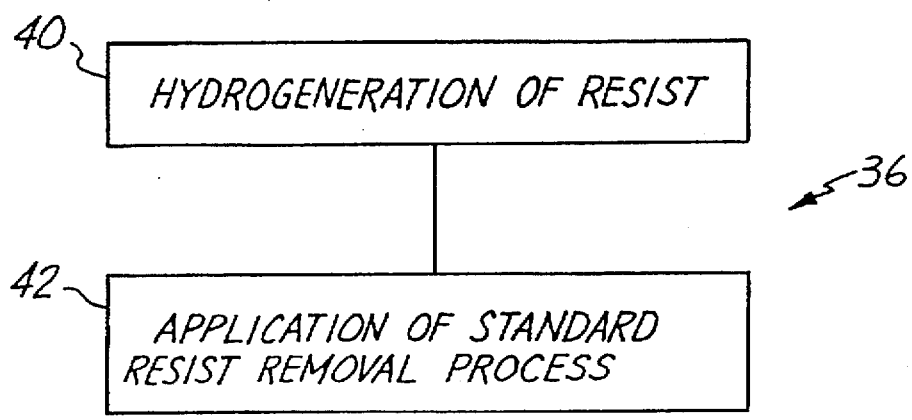
FIG. 3 is a flow diagram of the resist removal step of FIG. 2.

After the ion implantation step 34, the resist layer 16 is removed as represented by block 36 of FIG. 2. As shown in FIG. 3, the removal step 36 of the resist layer 16 is generally performed in two steps. First, the resist layer 16, and particularly upper resist region 22, is hydrogenated through step 40 and then a standard resist removal process is performed per step 42.

Because the upper resist region 22 has a decreased hydrogen concentration, hydrogenation of the upper resist region 22 is performed to assist in the removal of the upper resist region 22 to prevent damage to the substrate and/or the semiconductor device being fabricated with the utilization of a process using resist. The hydrogenation process 40 generally includes either treating the upper resist region 22 of the resist layer 16 to pressurized water vapor, or alternatively, the upper resist region 22 may be immersed in pressurized boiling water. Preferably, the resist layer 16 is treated with pressurized water vapor.

The hydrogenation of the resist layer 16, and particularly the resist region 22, by immersion includes immersing the wafer being fabricated into pressurized boiling water in an appropriate pressurizable vessel. Generally, the pressurized boiling water may have a pressure in the range of about 1.5 atm to about 4.0 atm correlated with a temperature in the range of about 100° C. to about 180° C. More preferably, the pressurized boiling water has a temperature in the range of about 120° C. to about 150° C. correlated with a pressure in the range of about 1.5 atm to about 3.0 atm.

The hydrogenation of the resist layer 22 by treating the upper resist region 22 with pressurized water vapor includes exposing the surface upper resist region 22 to the pressurized water vapor in an appropriate pressurizable vessel. Generally, the pressurized water vapor may have a pressure in the range of about 1.5 atm to about 4.0 atm correlated with a temperature in the range of about 100° C. to about 180° C. More preferably, the pressurized water vapor has a temperature in the range of about 120° C. to about 150° C. correlated with a pressure in the range of about 1.5 atm to about 3.0 atm.

In both hydrogenation methods, immersion in pressurized boiling water and treatment with pressurized water vapor, the longer the immersion and treatment time the greater the increase in hydrogen concentration of the resist region 22. Immersion or treatment for a period of time greater than 10 minutes will provide beneficial increases in hydrogen concentration and preferably the immersion or treatment time should be in the range of about 10 minutes to about 5 hours. It should also be apparent that a resist layer may be subject to both of these methods and in any order. Further, the resist layer may be treated or immersed more than once.

For example, the immersion in the pressurized boiling water or the treatment to the pressurized water vapor may be performed in utilizing deionized water in a pressurizable vessel or chamber such as a stainless steel vessel. In one instance, the pressurized boiling water or pressurized water vapor may be at a pressure of 2 atm and a temperature of 120° C. The level to which the water is deionized may be such that the electrical resistance is in the range of about 15 Mohms to about 18 Mohms. The heater, for example, may include any heating element operable in such a pressurized chamber or vessel, such as a stainless steel pipe which may lie in the water.

In both pressurized water vapor treatment and pressurized boiling water immersion, the water is ionized into $H^+$ and $OH^-$. The ion product of these H-related species, $[H^+][OH^-]$, increases to $8.9 \times 10^{-14}$ $M^2$ at 120° C. when extrapolated from $1.27 \times 10^{-14}$ $M^2$ at 25° C. and $7.2 \times 10^{-14}$ $M^2$ at 99° C. Furthermore, each atom will diffuse faster into the upper resist region 22 at 120° C. and 2 atm than at 100° C. and 1 atm. Significant hydrogenation of the upper resist region 22 at 120° C. and 2 atm results from both concentration increase of H-related species in water, and faster diffusion of the H atom in the resist material.

Following the hydrogenation step 40, the upper resist region 28 has a hydrogen concentration higher than the hydrogen concentration prior to such hydrogenation and after ion-implantation, and preferably, the hydrogen concentration of the resist region 28 after the hydrogenation step is substantially equivalent to or greater than the hydrogen concentration of the resist layer 16 prior to ion-plantation. Therefore, a standard resist removal process 42 can be utilized to remove both the hydrogenated upper resist region 28 and the lower region 24 of the resist layer 16.

Many different types of conventional resist removal processes are known to those skilled in the art. For example, there are wet chemical etching processes and dry plasma etching processes. Typically, the wet etching processes, utilize solvents such as, for example, hydrogen peroxide-sulfuric acid and those based on phenyl-methyl ethyl ketone and trichloroethylene.

For example, in a hydrogen peroxide-sulfuric acid system, a mixture of about 10–33.3% of hydrogen peroxide and 66.6–90% of sulfuric acid can be used for the complete removal of the resist. In general, such a system man be used for all resist removal processes except those requiring removal of the resist layers from an aluminum surface, since such a wet process will dissolve aluminum.

The class of wet etching solvents based on phenyl-methyl ethyl ketone and trichloroethylene is typically used on substrates having aluminum metalization layers since the resist development and the removal system does not chemically attack aluminum.

The nonsolvent, or dry plasma ashing processes, have also been employed for the purpose of removing resist. Such techniques employ plasma etching as obtained through an oxygen RF plasma process wherein the generated plasma containing monatomic oxygen as an active species is employed to remove the layer of resist material. Generally, plasma containing monatomic oxygen O may be generated by placing diatomic oxygen ($O_2$) molecules in an evacuated chamber and providing an electric field with sufficient force to disassociate the oxygen ($O_2$) molecules. The so-called plasma machines, or ashers, are generally AC systems operating at radio frequencies in the Khz range. Typically, two opposing horizontal flat electroplates or tubular electrodes are employed for purposes of generating plasma therebetween. As recognized in the art, the term "asher" is generally applied to an RF plasma machine employed for the purpose of removing resist material by plasma etching.

Another dry removal process employs an ozone treatment and involves the exposure of the resist layer to an ozone containing gaseous atmosphere in a reaction zone of a reactor. The ozone is present as an active reagent in the gaseous atmosphere to which the layer of resist material is exposed and is of an amount sufficient to react with all of the resist material in the layer thereof. The resist material is removed from the underlying substrate surface in response to exposure to the ozone.

Figure 1D:
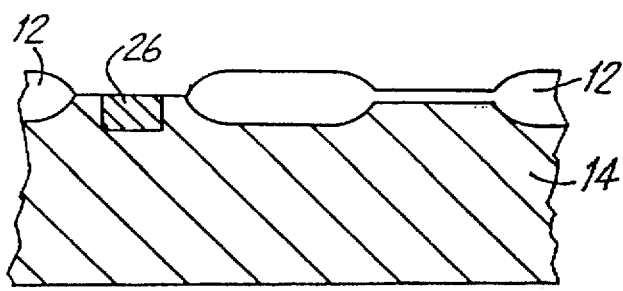
FIG. 1D is the partial cross-sectional view of FIG. 1C with the resist layer removed.

The standard method of removing the resist utilized after the hydrogenation of the upper resist region 28, results in the removal of the resist layer 16 as shown in FIG. 1D. The standard resist removal process, step 42, utilizes a resist process that is known to those skilled in the art. A few conventional resist removal processes are described above, however, other resist processes and variations of other wet and dry processes may be utilized in accordance with the present invention without departing from the contemplated scope of the present invention as described in the accompanying claims.

Although the invention has been described with particular reference to preferred embodiments thereof, variations and modifications to the present invention can be made within a contemplated scope of the claims as is readily known to one skilled in the art.

What is claimed is:

1. An ion-implanted resists removal method, the method comprising the steps of:

providing a substrate having a surface;

forming resist on at least a portion of the surface to define an opening to the surface of the substrate;

implanting ions into the substrate through the opening, the ion implantation resulting in an ion-implanted upper resist region and a lower resist region, the ion-implanted upper resist region has a decreased hydrogen concentration compared to the lower resist region;

hydrogenating the ion-implanted upper resist region of the resist resulting in a hydrogenated ion-implanted upper resist region; and removing the resist including the hydrogenated ion-implanted upper resist region and the lower resist region after hydrogenating the ion-implanted upper resist region.

2. The method according to claim 1, wherein the hydrogenating step includes the step of immersing the resist including the ion-implanted upper resist region into pressurized boiling water in a pressurizable unit, the pressurized boiling water having a temperature in a range of about 100° C. to about 180° C. correlated with a pressure in a range of about 1.5 atm to about 4.0 atm.

3. The method according to claim 1, wherein the hydrogenating step includes the step of treating the resist layer including the ion-implanted upper region with pressurized water vapor, the pressurized water vapor having a temperature in a range of about 100° C. to about 180° C. correlated with a pressure in a range of about 1.5 atm to about 4.0 atm.

4. The method according to claim 1, wherein the ion implantation step includes implanting ions at dosages in a range of about $1 \times 10^{14}$ atoms/cm$^2$ to about $1 \times 10^{16}$ atoms/cm$^2$.

5. An ion-implanted resist removal method, the method comprising the steps of:

providing a substrate having a surface;

forming resist on at least a portion of the surface to define an opening to the surface of the substrate;

implanting ions into the substrate through the opening, the ion implantation resulting in an ion-implanted upper resist region and a lower resist region, the ion-implanted upper resist region has a decreased hydrogen concentration compared to the lower resist region;

hydrogenating the resist including the ion-implanted upper resist region resulting in a hydrogenated ion-implanted upper resist region; and wet etching the resist to remove the hydrogenated ion-implanted upper resist region and the lower resist region after hydrogenating the ion-implanted upper resist region.

6. The method according to claim 5, wherein the hydrogenating step includes the step of immersing the resist including the ion-implanted upper resist region into pressurized boiling water in a pressurizable unit, the pressurized boiling water having a temperature in a range of about 100° C. to about 180° C. correlated with a pressure in a range of about 1.5 atm to about 4.0 atm.

7. The method according to claim 5, wherein the hydrogenating step includes the step of treating the resist layer including the ion-implanted upper region with pressurized water vapor, the pressurized water vapor having a temperature in a range of about 100° C. to about 180° C. correlated with a pressure in a range of about 1.5 atm to about 4.0 atm.

8. An ion-implanted resist removal method, the method comprising the steps of:

providing a substrate having a surface;

forming resist on at least a portion of the surface to define an opening to the surface of the substrate;

implanting ions into the substrate through the opening, the ion implantation resulting in an ion-implanted upper resist region and a lower resist region, the ion-implanted upper resist region has a decreased hydrogen concentration compared to the lower resist region;

hydrogenating the resist including the ion-implanted upper resist region resulting in a hydrogenated ion-implanted upper resist region; and dry etching the resist to remove the hydrogenated ion-implanted upper resist region and the lower resist region after hydrogenating the ion-implanted upper resist region.

9. The method according to claim 8, wherein the hydrogenating step includes the step of immersing the resist including the ion-implanted upper resist region into pressurized boiling water in a pressurizable unit, the pressurized boiling water having a temperature in a range of about 100° C. to about 180° C. correlated with a pressure in a range of about 1.5 atm to about 4.0 atm.

10. The method according to claim 8, wherein the hydrogenating step includes the step of treating the resist layer including the ion-implanted upper region with pressurized water vapor, the pressurized water vapor having a temperature in a range of about 100° C. to about 180° C. correlated with a pressure in a range of about 1.5 atm to about 4.0 atm.

11. An ion-implanted resist removal method, the method comprising the steps of:

providing a substrate having a surface;

forming resist on at least a portion of the surface to define an opening to the surface of the substrate;

implanting ions into the substrate through the opening, the ion implantation resulting in an ion-implanted upper resist region and a lower resist region, the ion-implanted upper resist region has a decreased hydrogen concentration compared to the lower resist region;

hydrogenating the ion-implanted upper resist region by immersing the resist including the ion-implanted upper resist region into pressurized boiling water in a pressurizable unit resulting in a hydrogenated ion-implanted upper resist region, the pressurized boiling water having a temperature in a range of about 100° C. to about 180° C. correlated with a pressure in a range of about 1.5 atm to about 4.0 atm; and removing the resist including the hydrogenated ion-implanted upper resist region after hydrogenating the ion-implanted upper resist region.

12. The method according to claim 11, wherein the pressurized boiling water has a temperature preferably in the range of about 120° C. to about 150° C. correlated with a pressure in the range of about 1.5 atm to about 3.0 atm.

13. An ion-implanted resist removal method, the method comprising the steps of:

providing a substrate having a surface;

forming resist on at least a portion of the surface to define an opening to the surface of the substrate;

implanting ions into the substrate through the opening, the ion implantation resulting in an ion-implanted upper resist region and a lower resist region, the ion-implanted upper resist region has a decreased hydrogen concentration compared to the lower resist region;

hydrogenating the ion-implanted upper resist region of the resist by treating the resist including the ion-implanted upper resist region with pressurized water vapor resulting in a hydrogenated ion-implanted upper resist region, the pressurized water vapor having a temperature in a range of about 100° C. to about 180° C. correlated with a pressure in a range of about 1.5 atm to about 4.0 atm; and removing the resist including the hydrogenated ion-implanted upper resist region.

14. The method according to claim 13, wherein the pressurized water vapor has a temperature preferably in the range of about 120° C. to about 150° C. correlated with a pressure in the range of about 1.5 atm to about 3.0 atm.

* * * * *

UNITED STATES PATENT AND TRADEMARK OFFICE
CERTIFICATE OF CORRECTION

PATENT NO. : 5,895,272
DATED : April 20, 1999
INVENTOR(S) : Li Li

It is certified that error appears in the above-identified patent and that said Letters Patent is hereby corrected as shown below:

Col. 3, line 36, delete "film's" and insert -- films --.
Col. 6, line 9, delete "man" and insert -- may --.
Col. 6, line 61, delete "resists" and insert -- resist --.

Signed and Sealed this

Eighth Day of May, 2001

*Attest:*

NICHOLAS P. GODICI

*Attesting Officer*     *Acting Director of the United States Patent and Trademark Office*